US010177365B2

(12) United States Patent
Mane et al.

(10) Patent No.: US 10,177,365 B2
(45) Date of Patent: Jan. 8, 2019

(54) METAL FLUORIDE PASSIVATION COATINGS PREPARED BY ATOMIC LAYER DEPOSITION FOR LI-ION BATTERIES

(71) Applicant: UChicago Argonne, LLC, Chicago, IL (US)

(72) Inventors: Anil U. Mane, Naperville, IL (US); Jeffrey W. Elam, Elmhurst, IL (US); Joong Sun Park, Woodridge, IL (US); Jason R. Croy, Plainfield, IL (US)

(73) Assignee: UChicago Argonne, LLC, Chicago, IL (US)

( * ) Notice: Subject to any disclaimer, the term of this patent is extended or adjusted under 35 U.S.C. 154(b) by 253 days.

(21) Appl. No.: 14/693,719

(22) Filed: Apr. 22, 2015

(65) Prior Publication Data

US 2016/0260962 A1 Sep. 8, 2016

Related U.S. Application Data

(60) Provisional application No. 62/128,944, filed on Mar. 5, 2015.

(51) Int. Cl.
*C23C 16/455* (2006.01)
*H01M 4/04* (2006.01)
(Continued)

(52) U.S. Cl.
CPC ........... *H01M 4/0421* (2013.01); *C23C 16/30* (2013.01); *C23C 16/45531* (2013.01);
(Continued)

(58) Field of Classification Search
CPC ....................... H01M 4/0421; C23C 16/45525
See application file for complete search history.

(56) References Cited

U.S. PATENT DOCUMENTS 8,921,799 B2   12/2014 Elam et al.
2009/0087362 A1*  4/2009 Sun .................... C01G 45/1221
                                                        423/179.5

(Continued)

*Primary Examiner* — Elizabeth A Burkhart
(74) *Attorney, Agent, or Firm* — Foley & Lardner LLP

(57) ABSTRACT

The fabrication of robust interfaces between transition metal oxides and non-aqueous electrolytes is one of the great challenges of lithium ion batteries. Atomic layer deposition (ALD) of aluminum tungsten fluoride ($AlW_xF_y$) improves the electrochemical stability of $LiCoO_2$. $AlW_xF_y$ thin films were deposited by combining trimethylaluminum and tungsten hexafluoride. in-situ quartz crystal microbalance and transmission electron microscopy studies show that the films grow in a layer-by-layer fashion and are amorphous nature. Ultrathin $AlW_xF_y$ coatings (<10 Å) on $LiCoO_2$ significantly enhance stability relative to bare $LiCoO_2$ when cycled to 4.4 V. The coated LiCoO2 exhibited superior rate capability (up to 400 mA/g) and discharge capacities at a current of 400 mA/g were 51% and 92% of the first cycle capacities for the bare and $AlW_xF_y$ coated materials. These results open new possibilities for designing ultrathin and electrochemically robust coatings of metal fluorides via ALD to enhance the stability of Li-ion electrodes.

9 Claims, 13 Drawing Sheets

(51) Int. Cl.
  *H01M 4/1391*    (2010.01)
  *H01M 4/131*     (2010.01)
  *H01M 4/62*      (2006.01)
  *H01M 4/36*      (2006.01)
  *C23C 16/30*     (2006.01)
  *H01M 4/505*     (2010.01)
  *H01M 10/0525*   (2010.01)

(52) U.S. Cl.
  CPC ....... *C23C 16/45555* (2013.01); *H01M 4/131* (2013.01); *H01M 4/1391* (2013.01); *H01M 4/366* (2013.01); *H01M 4/505* (2013.01); *H01M 4/628* (2013.01); *H01M 10/0525* (2013.01)

(56) References Cited

U.S. PATENT DOCUMENTS

| | | | | |
|---|---|---|---|---|
| 2009/0155590 | A1* | 6/2009 | Kelder | B01J 2/16 428/403 |
| 2012/0187305 | A1* | 7/2012 | Elam | H01J 43/246 250/390.01 |
| 2013/0335190 | A1* | 12/2013 | Elam | H01C 7/006 338/204 |
| 2014/0113197 | A1* | 4/2014 | Xiao | H01M 4/131 429/223 |
| 2014/0302392 | A1 | 10/2014 | Li et al. | |

\* cited by examiner

METAL FLUORIDE PASSIVATION COATINGS PREPARED BY ATOMIC LAYER DEPOSITION FOR LI-ION BATTERIES

CROSS-REFERENCE TO RELATED APPLICATIONS

This application claims the benefit of U.S. Provisional Application No. 62/128,944 filed on Mar. 5, 2015, which is hereby incorporated by reference in its entirety.

STATEMENT OF GOVERNMENT INTEREST

The United States Government has rights in the invention described herein pursuant to Contract No. DE-AC02-06CH11357 between the United States Department of Energy and UChicago Argonne, LLC, as operator of Argonne National Laboratory.

FIELD OF THE INVENTION

The present invention generally relates deposited coatings, specifically to atomic layer deposition of metal fluoride coatings.

BACKGROUND OF THE INVENTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

The fabrication of robust interfaces between electrodes and electrolytes that satisfy the application-dependent, electrochemical demands of various systems is one of the great challenges of interfacial science. In particular, irreversible reactions between non-aqueous electrolytes and metal oxides are often considered to be a rate-limiting step adversely affecting the overall performance of lithium-ion (Li-ion) batteries. Li-Ion batteries, in general, suffer irreversible capacity losses during high voltage operation due, in part, to corrosion of active materials in the acidic electrolyte as well as electrolyte decomposition. Small levels of moisture (~20-100 ppm) present in battery-grade electrolytes can react with lithium salts (e.g. $LiPF_6$) to generate hydrofluoric acid (HF). HF subsequently attacks the surfaces of electrode materials causing transition metal dissolution and migration to the negative electrode. Furthermore, surface layers can form as a result of electrolyte oxidation at high voltages which impede Li-ion diffusion.

Coating electrode surfaces with metal oxides such as $Al_2O_3$, MgO, ZnO, and $TiO_2$ has proven to be effective in mitigating irreversible side reactions. These metal oxides coatings, however, are also susceptible to HF attack and may not be stable over long-term cycling, converting partially to metal fluorides when scavenging HF as reported earlier. Furthermore, byproducts of these reactions generate additional water in the electrolyte again making electrode/electrolyte interfaces unstable. In addition, the high electronegativity of fluorine results in strongly bonded cations relative to oxygen and should be beneficial in limiting unwanted surface reactions. In particular, $AlF_3$-coated positive electrodes ($LiCoO_2$, $LiNi_{1/3}Mn_{1/3}Co_{1/3}O_2$, $Li[Li_{0.19}Mn_{0.57}Ni_{0.16}Co_{0.08}]O_2$, etc.) have demonstrated significant improvements in cycling stability and safety when $AlF_3$ is applied via solution-based routes. The $AlF_3$ layers provide some resistivity to HF attack, but are insulating resulting in decreased cathode performance.

However, wet-chemical processes, as well as standard physical vapor deposition (PVD), have limitations. Non-uniform thicknesses and/or compositional variation of coating layers can arise from the directional nature of deposition (PVD) or by the secondary heating steps required for solution-based routes. As thickness can alter the impact the layer has on the underlying cathode performance, the ability to finely tune and control thickness is important.

SUMMARY OF THE INVENTION

One embodiment of the invention relates to a method of preparing a metal fluoride passivation coating on a cathode comprising: performing an atomic layer deposition cycles of TMA at a first deposition temperature between 50° C. and 300° C.; and performing b atomic layer deposition cycles of $WF_6$ at a second deposition temperature between 50° C. and 300° C.

Another embodiment relates to a battery comprising a LiCoO2 cathode core; a metal fluoride passivation coating conformally coated on the cathode core; the metal fluoride passivation coating consisting essentially of $AlW_xF_yC_z$ wherein x and y are greater than 0.

Additional features, advantages, and embodiments of the present disclosure may be set forth from consideration of the following detailed description, drawings, and claims. Moreover, it is to be understood that both the foregoing summary of the present disclosure and the following detailed description are exemplary and intended to provide further explanation without further limiting the scope of the present disclosure claimed.

BRIEF DESCRIPTION OF THE DRAWINGS

The foregoing and other objects, aspects, features, and advantages of the disclosure will become more apparent and better understood by referring to the following description taken in conjunction with the accompanying drawings, in which.

DETAILED DESCRIPTION OF THE PREFERRED EMBODIMENTS

Figure 1A:
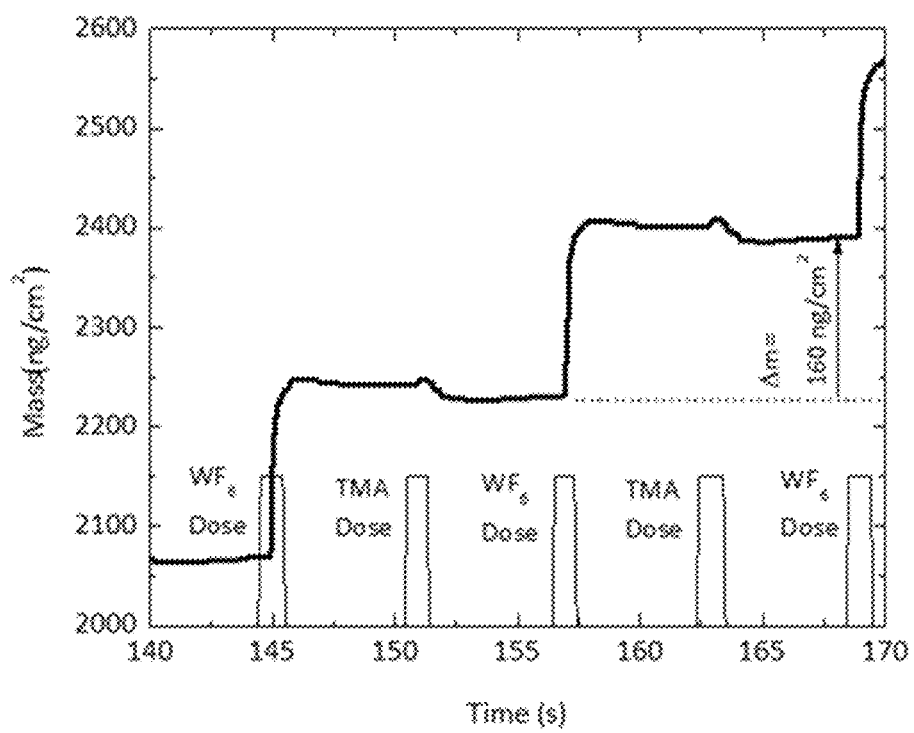
FIGS. 1A-B illustrate (FIG. 1A) in-situ QCM mass-uptake during two alternating cycles of $WF_6$ and TMA and (FIG. 1B) HRTEM image of the films deposited using alternating exposures to TMA-$WF_6$ on an ALD $Al_2O_3$-coated Si wafer (inset: NBD of the $AlW_xF_y$ film with beam size of ~50 nm).

Atomic layer deposition (ALD) is a modified form of chemical vapor deposition (CVD) that uses the self-limiting nature of specific precursors to deposit films in a layer-by-layer fashion. ALD is particularly well-suited for coating electrode surfaces in that a conformal coating can be applied with precise control of thickness and composition. Previous studies on ALD-coated electrodes have primarily focused on metal oxides such as $Al_2O_3$, $TiO_2$, $LiAlO_2$, and $LiTaO_3$ because the ALD chemistry of these oxides is well known. Metal fluoride growth by ALD is complex and challenging, mainly due to the lack of suitable fluorine precursors. For example, HF, a highly aggressive chemical etching agent, has been used to deposit $CaF_2$, $ZnF_2$, and $SrF_2$. More recently, alternative ALD chemistries have been developed such as $MgF_2$ and LiF ALD using either $TaF_5$ or $TiF_4$ as the fluorine precursor for optical applications. However, the substrate temperatures in these cases were 300-400° C.; high enough to degrade battery electrode laminates containing polymeric binders. Another potential limitation of $AlF_3$ for Li-Ion batteries is that it is a wide-bandgap dielectric and hence electrically insulating. Although still promising as a coating, methods to enhance the material's conductivity while maintaining its superb resistance to chemical attack could be advantageous.

U.S. Pat. No. 8,921,799 and pending application published as U.S. Pat. App. Pub. No. 2012/0187305 describe a general method and materials from the method relating to atomic layer deposition of a composite coating. Described herein is a method for and composition and product having ultrathin, amorphous, composite aluminum-tungsten-fluoride ($AlW_xF_y$) films on, in one embodiment, $LiCoO_2$ electrodes via ALD using, in one embodiment, trimethyaluminum (TMA) and tungsten hexafluoride ($WF_6$), at 50° C. to 300° C. preferably at 200° C. Such films are created with metal fluoride and do not utilize a metal oxide. There is no oxidant step involved in TMA-WF6 process; TMA reduces tungsten terminated surface in various embodiments, $AlW_xF_yC_z$ is formed where x and y are any non-zero positive number and wherein z can be zero (no carbide), or any positive number. These films are highly conducting, but incorporate $AlF_3$ in the composite. Although $LiCoO_2$ is the most commercially successful cathode material for Li-ion batteries, the practical use of $LiCoO_2$ is limited, in part, to surface reactions involving cobalt dissolution, electrolyte oxidation, as well as structural transformations occurring at potentials higher than ~4.3 V (vs. Li/Li⁺). As such, $LiCoO_2$ might be considered as a model system for surface studies on Li-ion cathodes. Ultrathin $AlW_xF_y$ coatings (~1 nm) on $LiCoO_2$ are shown to significantly increase stability relative to bare $LiCoO_2$ when cycled up to 4.4 V. These results reveal new possibilities for designing ultrathin and electrochemically robust coatings of metal fluorides via ALD, and potentially other techniques, to enhance the stability of Li-ion electrodes. Using high vapor pressure precursors are beneficial when implemented in role-to-role ALD or spatial ALD.

Figure 7:
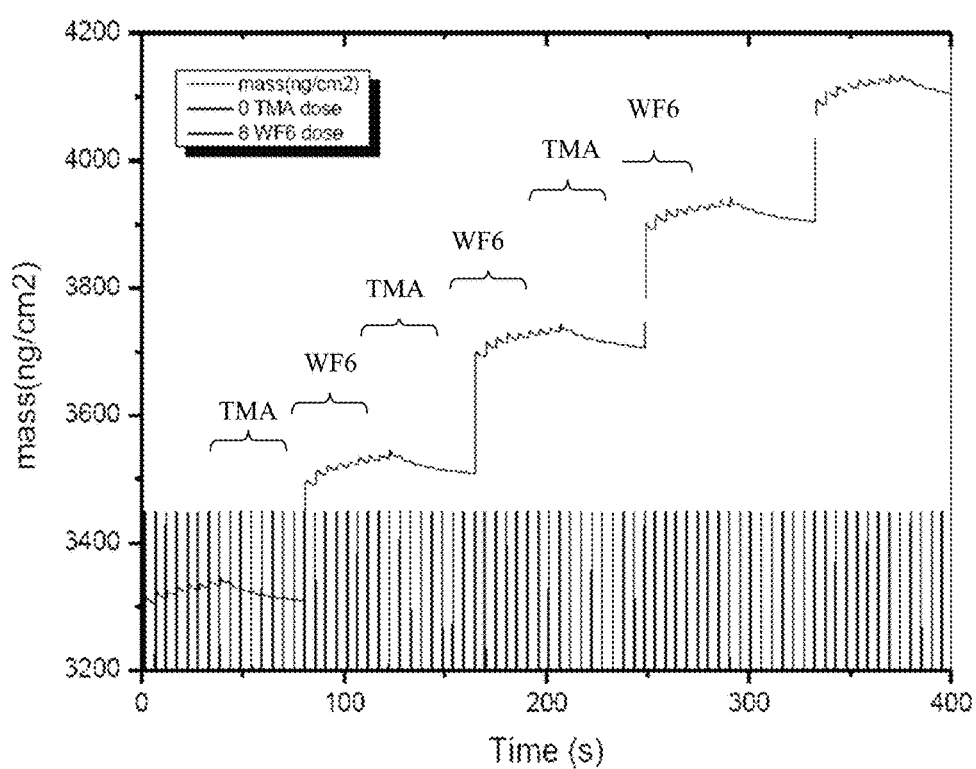
FIG. 7 illustrates the self-limiting growth of TMA-WF6 ALD.

ALD of $AlW_xF_y$ was accomplished using alternating exposures of $WF_6$ and TMA. In-situ quartz crystal microbalance (QCM) measurements recorded during alternating, 1 second $WF_6$ and TMA exposures at 200° C. showed a staircase pattern comprised of 160 $ng/cm^2$ steps consistent with layer-by-layer growth (FIG. 1A). Substrate temperature below 200 C is desirable when ALD is applied to electrode laminates composed of active material, carbon, and polymeric binder. Additional QCM measurements verified that each of the precursor exposures was self-limiting under these conditions. FIG. 7 illustrates the self-limiting growth of TMA-WF6 ALD. Ellipsometric measurements indicated a growth rate of 2.56 Å/cycle, and combined with the QCM data yield a film density of 6.5 $g/cm^3$. The resulting films appear amorphous by X-ray diffraction are highly conducting; four-point probe measurements give a resistivity of $3.5 \times 10^{-2}$ Ωcm. The growth rate of the film, deposited by alternating cycles of TMA-$WF_6$, is relatively high compared to that of typical oxides (~1-1.5 Å/cycle) and is due in part to tungsten and/or tungsten carbide byproducts that have growth rates of 2.5 Å/cycle.

Figure 1B:
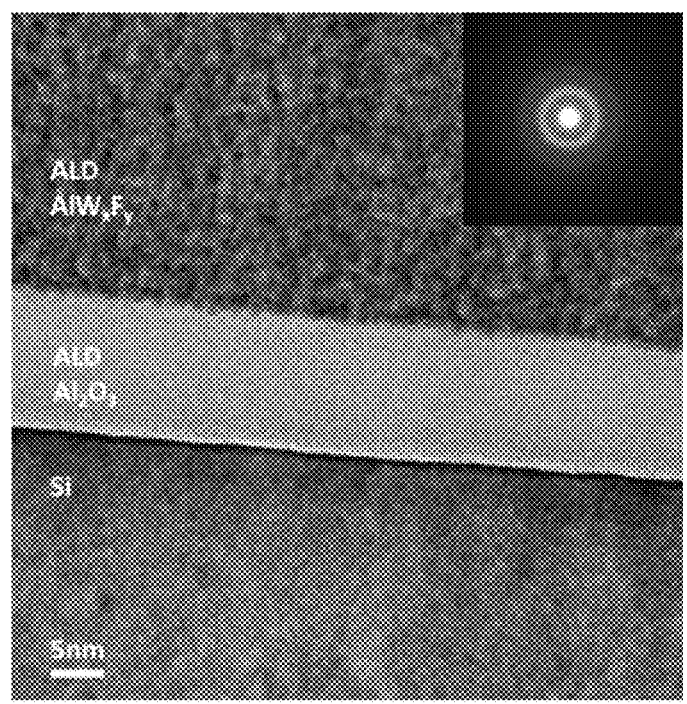
Figure 5:
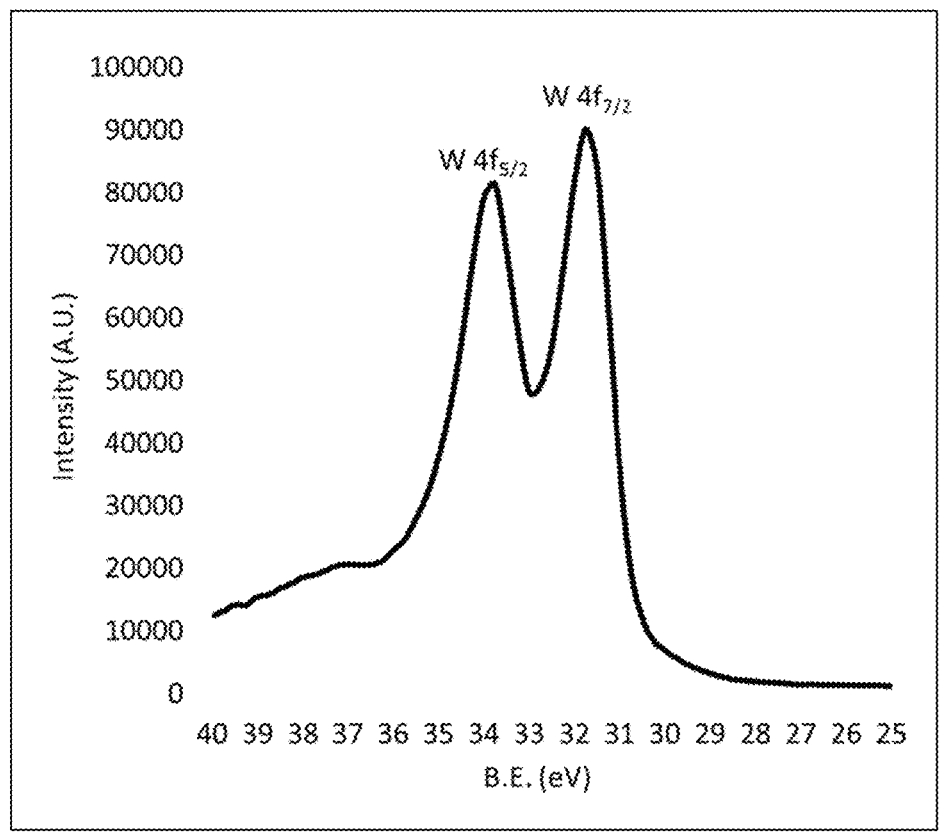
FIG. 5 shows XPS spectrum of tungsten in the ALD $AlW_xF_y$ film deposited on silicon

X-ray photoelectron spectroscopy (XPS) survey scans, performed during depth-profiling of these films deposited on silicon, revealed that they are comprised of W, C, Al, and F. Higher resolution XPS analysis demonstrated that the Al and F are bound as $AlF_3$, and that the W may be present as both metallic W and tungsten carbide ($WC_z$) (See FIG. 5). For brevity, in this application these films are referred to as $AlW_xF_y$ or $AlW_xF_yC_z$ where z may equal zero to reflect that carbide may or may not be included. High resolution transmission electron microscopy (HRTEM) and nano-beam diffraction (NBD) measurements, taken from cross-sections of an $AlW_xF_y$ film deposited on $Al_2O_3$-coated silicon (FIG. 1B), confirmed the amorphous nature of the films. These measurements also revealed that the $AlW_xF_y$ exists as a nanocomposite of 1 nm particles in a matrix of lower density. It is believed that the darker particles in FIG. 1B are W and $WC_z$ while the surrounding matrix of lower density material is $AlF_3$. In one embodiment, particles are uniformly dispersed in the matrix from TEM, but can be controlled by ALD sequence; WF6-WF6 pulsing might generate localized nanoparticles. It is believed that TMA pulse on WF6 terminated surface reduces tungsten to form metallic or carbide form while fluorine create stable bonding with Al.

Figure 2A:
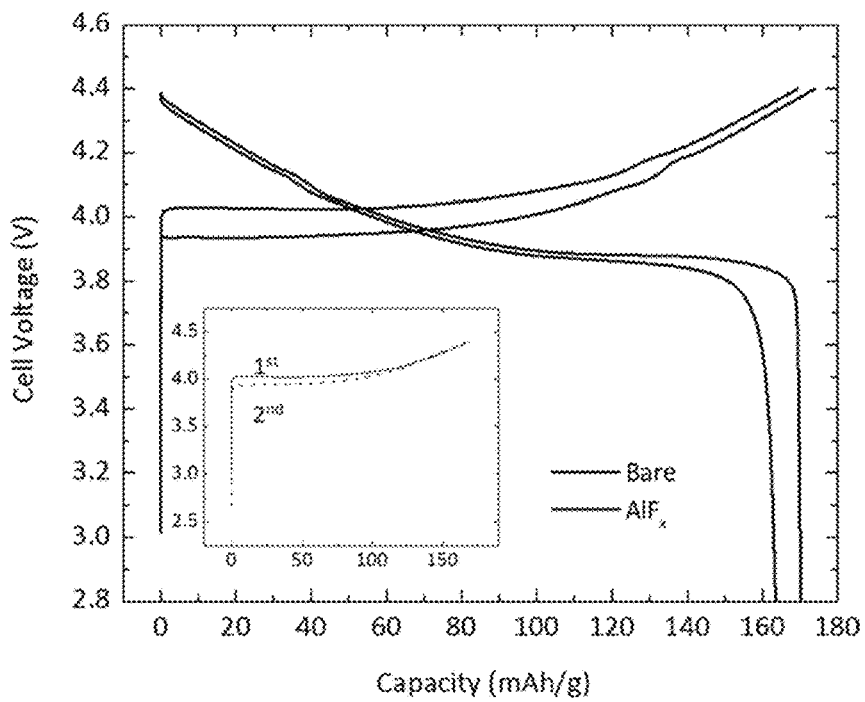
FIGS. 2 A-B illustrates (FIG. 2A) First-cycle voltage profiles of bare (black) and $AlW_xF_y$-coated (red) $LiCoO_2$ between 4.4-2.5 V at 20 mA/g; the inset shows first- and second-charge voltage profiles of the coated $LiCoO_2$ and (FIG. 2B) Discharge capacities of bare (black) and coated (red) $Li^+/LiCoO_2$ cells at a current rate of 20 mA/g between 4.4-2.5 V; the inset shows Coulombic efficiencies of the samples.
Figure 2B:
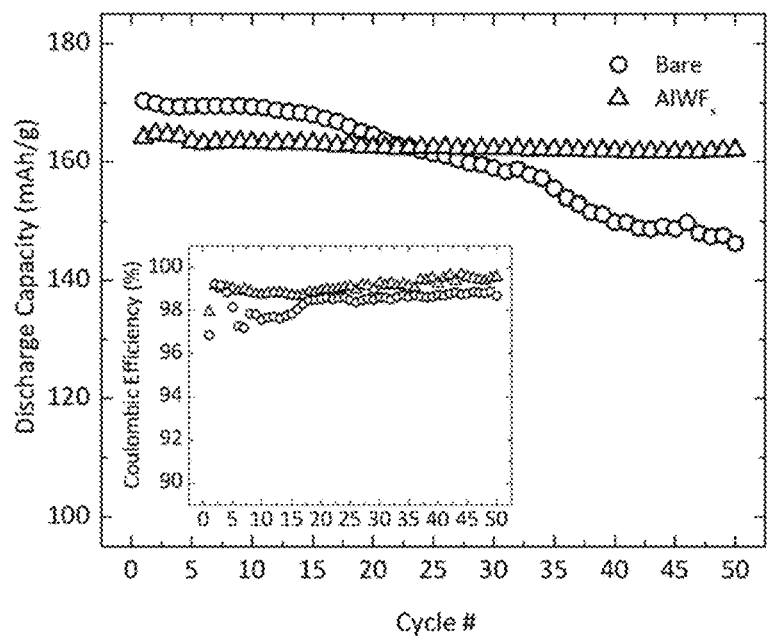
Figure 6:
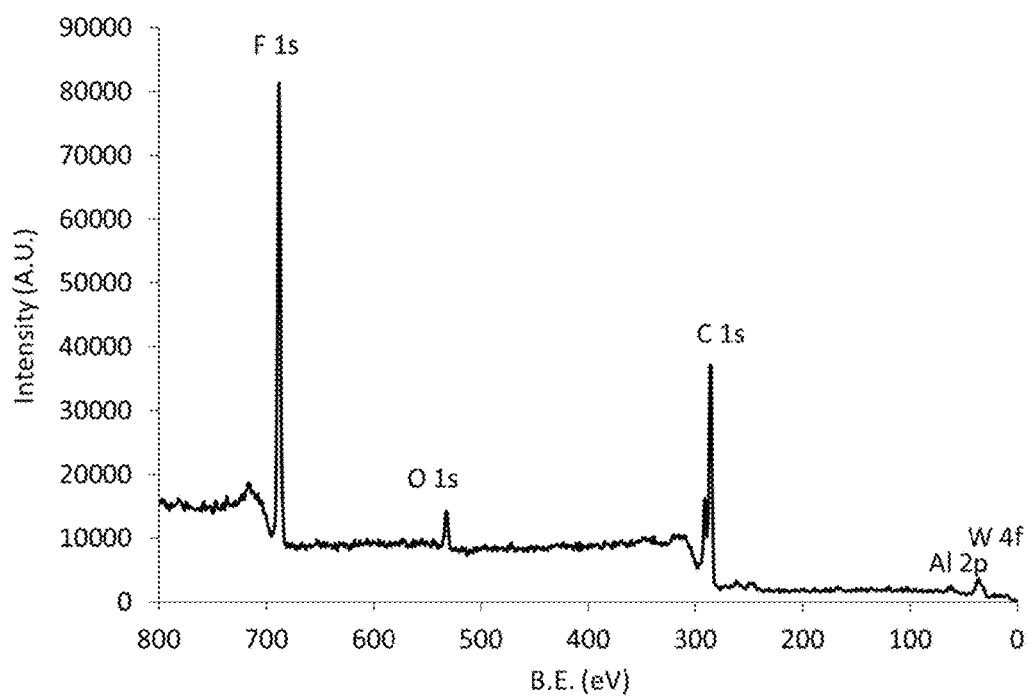
FIG. 6 shows XPS survey spectrum of ALD $AlW_xF_y$ film deposited on $LiCoO_2$ laminate.
Figure 8:
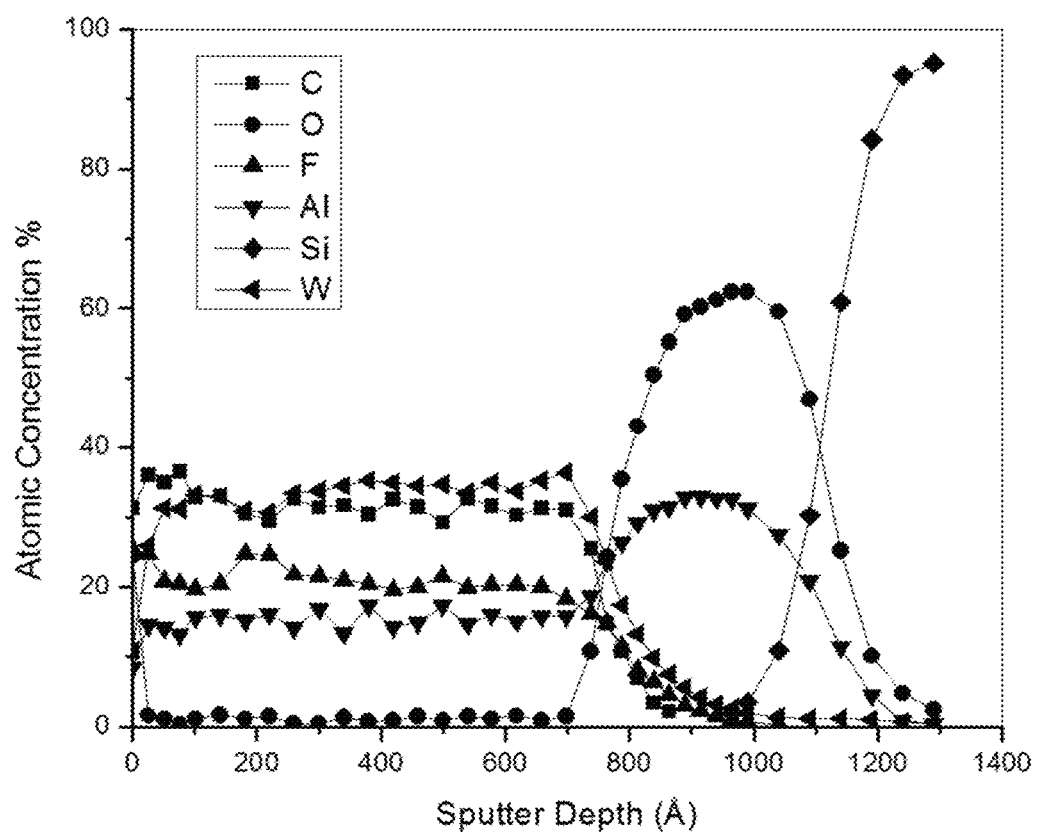
FIG. 8 illustrates characterization of an ALD coated $AlW_xF_y$ layer.

To evaluate the electrochemical properties of the $AlW_xF_y$ coating, 5 ALD cycles of TMA-$N_2$-$WF_6$-$N_2$ (~1 nm) were applied on laminates of $LiCoO_2$. XPS survey scan of coated $LiCoO_2$ confirmed that the $AlW_xF_y$ films are deposited on the laminates (FIG. 6). FIG. 8 illustrates characterization of a ALD coated $ALW_xF_yC_z$ layer. FIG. 2A shows first-cycle voltage profiles of two Li⁺/$LiCoO_2$ cells, with and without $AlW_xF_y$ coatings, between 4.4-2.5 V at 20 mA/g. Uncoated $LiCoO_2$ exhibited first-cycle capacities of ~170 mAh/g compared to ~165 mAh/g of the coated sample. This difference, though fairly negligible, might be attributed to the inactive nature of the coating layer resulting in slightly higher first-cycle impedance. The polarization on charging, however, disappeared after the first cycle indicating possible changes, such as a lithiated phase in the film, allowing diffusion of lithium ions and similar lithium extraction/insertion voltages as the uncoated electrode (inset FIG. 2A). Recent molecular dynamics (MD) calculations on $Al_2O_3$ coating suggests that the $Al_2O_3$ coating layer absorbs lithium until it reaches the thermodynamically stable composition during the lithiation process. The characteristic hexagonal to monoclinic transformation of $LiCoO_2$ occurring at ~4.1 V is observed for both cells, though slightly less pronounced for the coated electrode. This is an indication that the ALD coating process did not drastically alter the bulk characteristics of the material; similar to previous coating studies on $LiCoO_2$. The discharge capacity of the uncoated $LiCoO_2$ continuously decreased while the coated electrode showed excellent capacity retention over the course of cycling between 4.4-2.5 V. The bare $LiCoO_2$ retained only 85% of its initial capacity, while the 1 nm $AlW_xF_y$ coating enabled a 99% capacity retention after 50 charge-discharge cycles as shown FIG. 2B. The capacity loss of the bare material is attributed to parasitic, interfacial reactions as previously reported. It should be noted that thicker (~10 nm) $AlW_xF_y$ coatings on $LiCoO_2$ showed discharge capacities of just ~10 mAh/g, revealing a limitation in practical thicknesses. There is a trade-off between protection capability and facile diffusion of lithium ion. A 1 nm thick $AlW_xF_y$ allows diffusion of lithium and protect underlying electrodes.

Figure 3A:
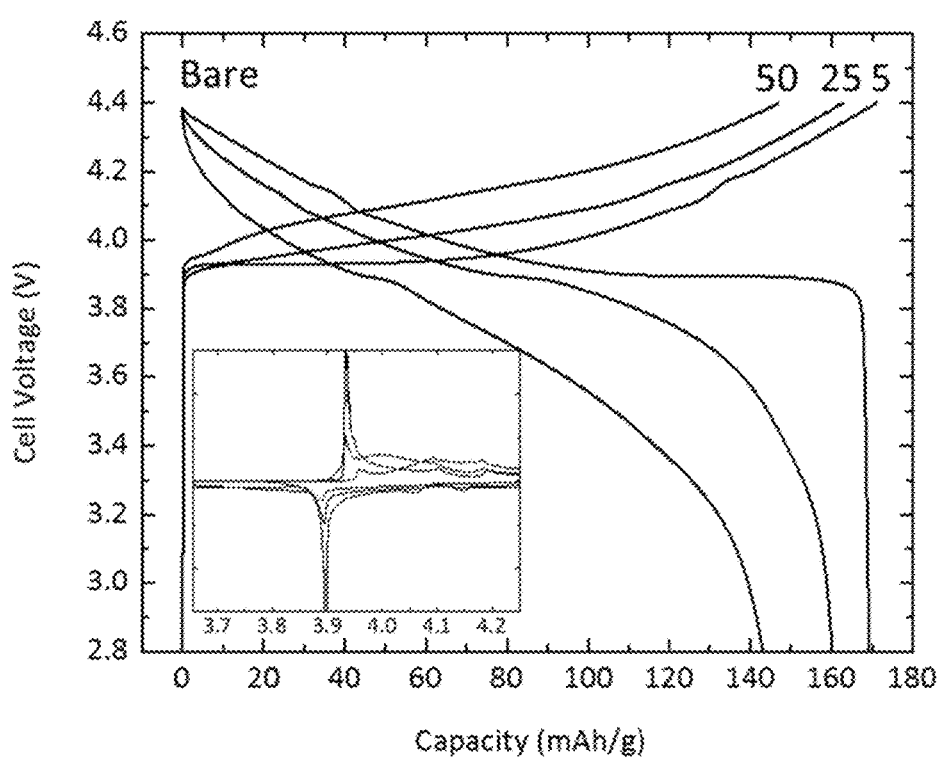
FIGS. 3A-C show Voltage profiles of (FIG. 3A) bare and (FIG. 3B) $AlW_xF_y$ coated $LiCoO_2$ on cycles 5, 25, and 50 and corresponding dQ/d V plots of bare and coated $LiCoO_2$ (inset), as well as (FIG. 3C) Al2p XPS spectra of $AlW_xF_y$-coated $LiCoO_2$ before and after $50^{th}$ cycle.
Figure 3B:
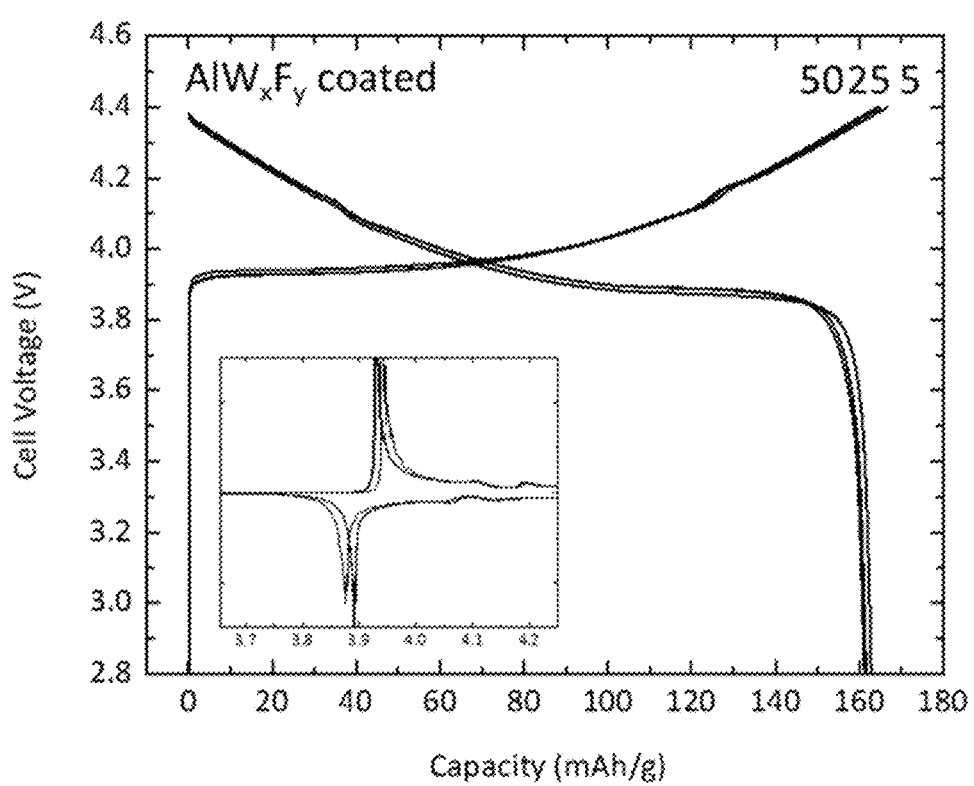
Figure 3C:
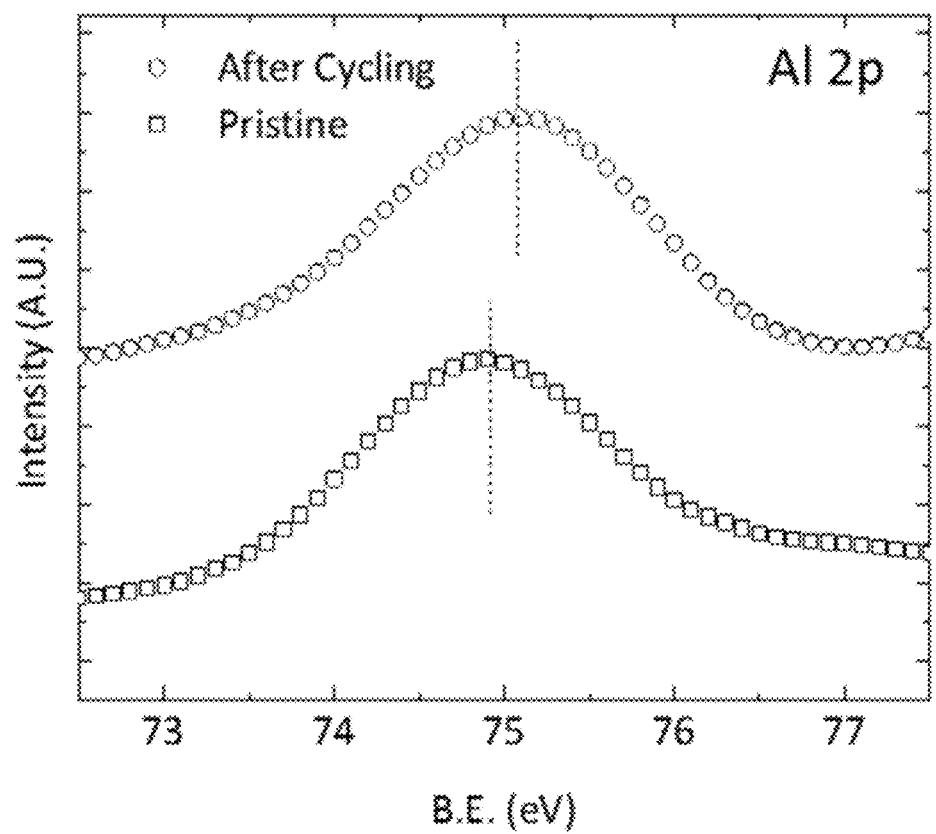

FIGS. 3A and 3B show voltage profiles and corresponding differential capacity (dQ/dV) plots of bare and coated samples on cycles 5, 25, and 50. Voltage profiles of the uncoated $LiCoO_2$ clearly showed increased polarization on charge and discharge with continued cycling accompanied by a broadening and shifting of the dQ/dV peaks; typical of increasing impedance and structural degradation. On the other hand, voltage profiles and dQ/dV plots of the $AlW_xF_y$-coated material showed little change upon cycling. This data reveals that the phase transition associated with lithium ordering at ~4.1 V is a relatively "soft" transition and a significant fraction of the lithium can be repeatedly, and reversibly, extracted without significant damage to the bulk of the structure. Furthermore, it is clear that surface damage, mitigated here by the $AlW_xF_y$ film, is a much greater factor in the degradation of $LiCoO_2$ under these cycling conditions. XPS studies were employed on $AlW_xF_y$-coated materials to probe the chemical composition of the surface before/after the electrochemical cycling. FIG. 3C shows Al $2p_{3/2}$ spectra of pristine, coated $LiCoO_2$ and after 50 cycles. The binding energy of the pristine and cycled samples was fitted to 74.9 eV and 75.0 eV, respectively, indicating only marginal change in the binding energy after electrochemical cycling and a stable $AlW_xF_y$ coating under insertion/extraction of lithium. The fitted value is higher than those of $Al_2O_3$ (74.2 eV) and $LiAlO_2$ (73.4 eV), and is closer to O—Al—F bonding as reported earlier.

Figure 4:
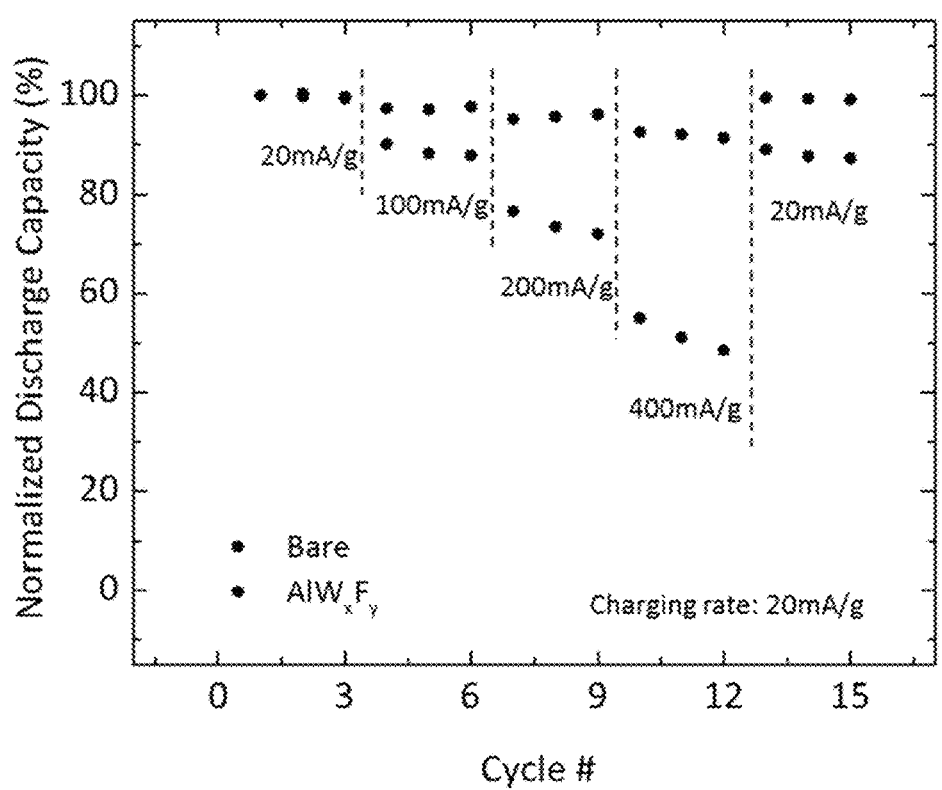
FIG. 4 illustrates rate capabilities of bare (black) and $AlW_xF_y$-coated (red) $LiCoO_2$ electrodes.

FIG. 4 compares the rate capability up to 400 mA/g for the coated and uncoated $LiCoO_2$. $AlW_xF_y$-coated $LiCoO_2$ exhibited superior rate capability at all current rates compared to the uncoated material, but the most dramatic improvements occurred at the highest rates (200-400 m Ng). Discharge capacities at a current of 400 mA/g were 51% and 92% of the first-cycle capacities for bare and $AlW_xF_y$ materials respectively. It is well known that reactions at electrode/electrolyte interfaces result in surface films that greatly increase cathode electrode impedances, thereby, causing capacity fade and poor power performance. Furthermore, it has been shown, in agreement with our results in FIG. 3B, that mitigating reactions at the surface of $LiCoO_2$ results in more stable bulk processes. As such, the data herein clearly demonstrate the improved surface stability of $AlW_xF_y$-coated $LiCoO_2$, resulting in excellent electrochemical performance.

Figure 9:
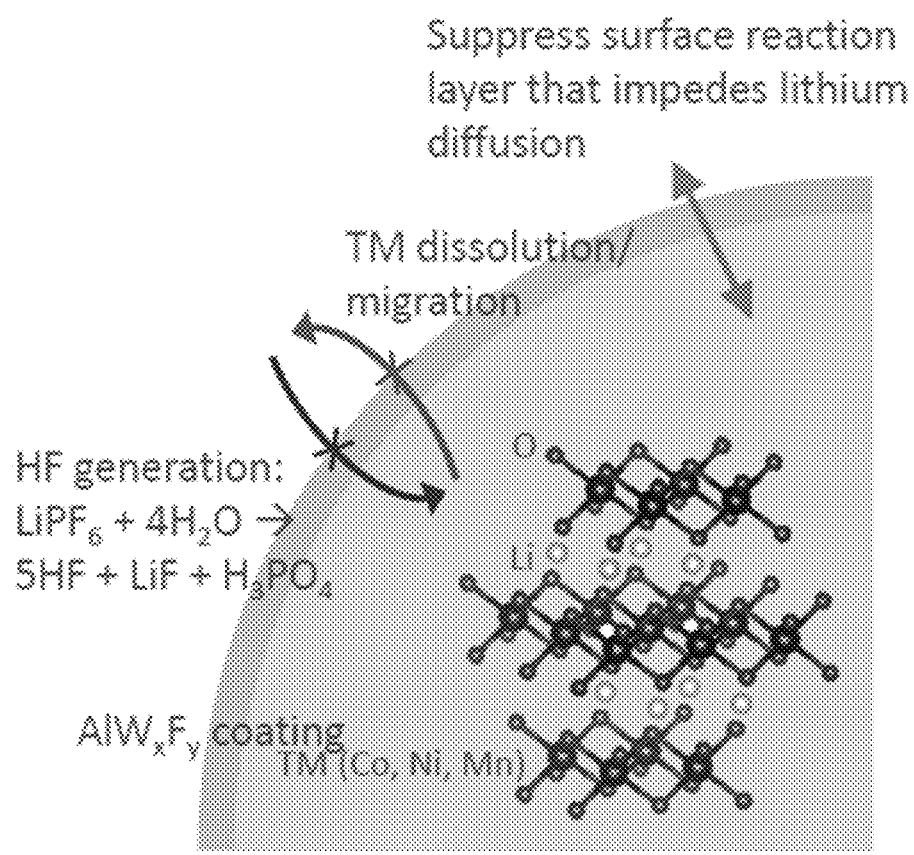
FIG. 9 illustrates the interactions of the layers in one embodiment demonstrating the resistance to diffusion of lithium.

FIG. 9 illustrates the interactions of the layers in one embodiment demonstrating the resistance to diffusion of lithium. The AlWxFyCz coating resists HF and transition metal dissolution from the cathode.

Figure 10:
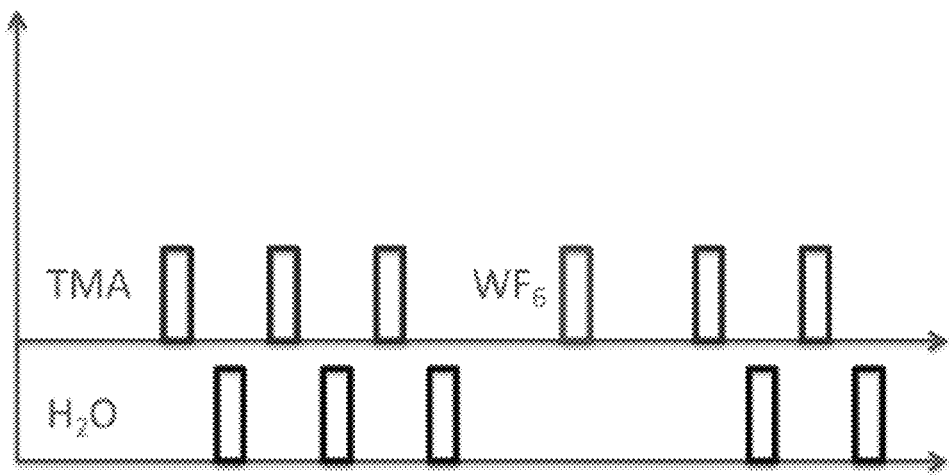
FIG. 10 is a graph illustrating the sequence of cycles in one embodiment where a 3:1 cycle sequence is applied.
Figure 11:
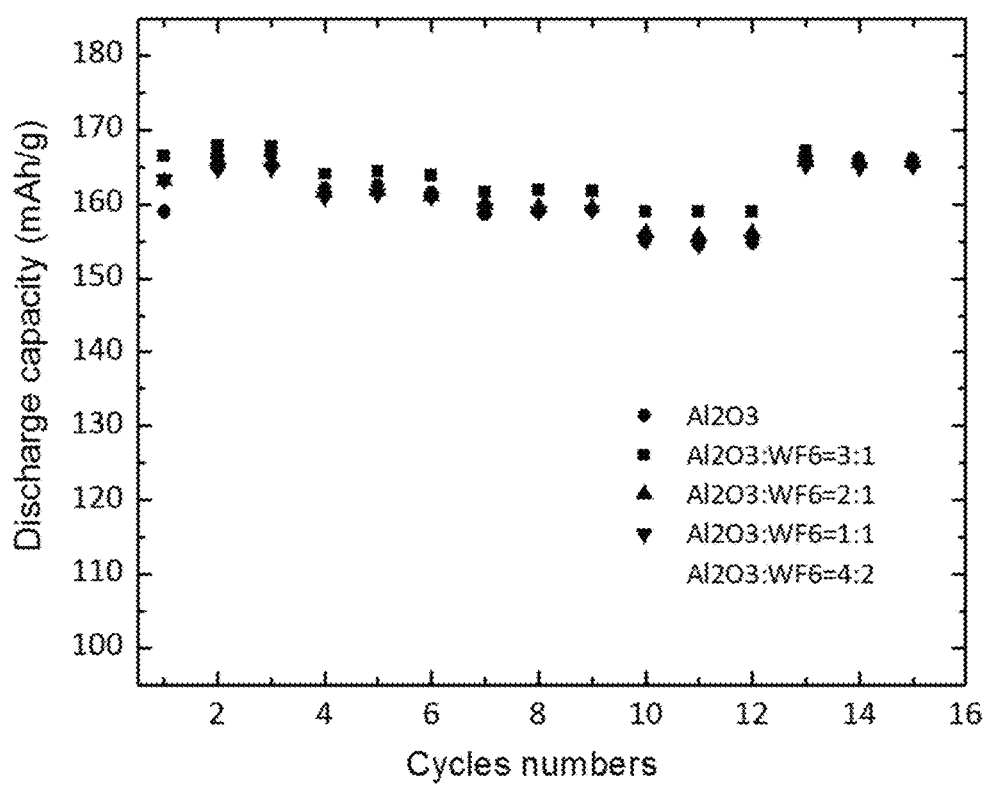
FIG. 11 illustrates a graph of the number of supercycles for various ratios demonstrating a similar thickness with different compositions resultant from the differing ratios.

Various cycles and supercycle arrangements can be utilized. FIG. 10 is a graph illustrating the sequence of cycles in one embodiment where a 3:1 cycle sequence is applied. FIG. 11 illustrates a graph of the number of supercycles for various ratios demonstrating a similar thickness with different compositions resultant from the differing ratios. Generally, the ALD supercycle comprises (a[TMA-H2O].bWF6)× n=total number. In that supercycle, a and b can be, for example, 3:1, 2:1, 1:1, 4:2. The total thickness may be the same for different compositions by varying the a:b ratio. For example, (3:1)×3, (2:1)×4, (1:1)×6, (4:2)×2~similar thickness with different compositions.

In summary, a novel ALD process allowing the deposition of metal fluoride materials has been developed for surface protection of Li-ion battery electrodes. A~1 nm $AlW_xF_y$ film deposited on $LiCoO_2$ electrodes has been shown to dramatically enhance cycle life and rate capability of $Li^+/LiCoO_2$ cells. These $AlW_xF_y$ thin film composites appear to combine the chemical inertness of $AlF_3$ with the high electrical conductivity of a metal. This study suggests new opportunities for ALD and the design of advanced surface structures enabling high capacity lithium ion batteries. Moreover, adjusting the composition of the ALD composites may yield further improvements in performance.

Atomic Layer Deposition:

Aluminum fluoride-based composite films were deposited via sequential pulsing of trimethylalumium (TMA) (97%, Sigma Aldrich) and tungsten hexafluoride ($WF_6$) (99.8%, Sigma Aldrich). The deposition was performed at 200° C. in a hot-walled viscous flow ALD reactor. TMA and $WF_6$ precursors were maintained at room temperature and ultra-high purity $N_2$ was used as a carrier gas with 300 sccm. The base pressure of the ALD reaction chamber was maintained at ~1.0 Torr. TMA and $WF_6$ were alternatively pulsed into the 15 sccm of $N_2$ carrier flow with the following time sequence: 1 s $WF_6$ dose-5 s purge-1 s TMA dose-5 s purge. An in situ QCM study was performed to study the nature of the deposition. The QCM measurements typically used longer $N_2$ purge times of 10 s to allow the QCM signal to stabilize after each precursor exposure. The thicknesses of $AlW_xF_y$ coating layers were determined by ex situ spectroscopic ellipsometry using a Cauchy model (Alpha-SE, J. A. Woollam Co.). The resistance of the film deposited on fused silica was determined by performing current-voltage (I-V) measurements using a four point probe measurement (Keithley Model 6487 current voltage source). X-ray photoelectron spectroscopy of $AlW_xF_y$ films deposited on silicon was performed by Evans Analytical Group.

Transmission Electron Microscopy:

Microstructure and crystallinity of $AlW_xF_y$ films deposited on silicon wafer were analyzed using TEM. TEM analysis was performed by Evans Analytical Group (Sunnyvale, Calif.). Cross-section TEM samples were prepared using the in-situ focused ion beam (FIB) lift out technique on an FEI Strata Dual Beam FIB/SEM. The samples were capped with a protective layer of carbon prior to FIB milling, and were imaged with a FEI Tecnai TF-20 FEG/TEM operated at 200 kV in bright-field (BF) TEM mode, high-resolution (HR) TEM mode, and nano-beam diffraction (NBD) mode.

Electrochemical Measurements:

The $LiCoO_2$ electrodes were prepared by mixing a slurry of commercial $LiCoO_2$ powder (Sigma-Aldrich), Super-P carbon, and polyvinylidenedifluoride (PVDF) with a mass ratio of 84:8:8 in N-methyl pyrrolidone (NMP). The mixed slurry was caste on an aluminum foil current collector. $AlW_xF_y$ films were deposited via ALD on the finished electrode laminates with thicknesses of ~1 nm. 2032-type coin cells were assembled in an Ar-filled glovebox (water and oxygen 1 ppm) with metallic lithium anodes. The electrolyte consisted of a 1.2M $LiPF_6$ solution in ethylene carbonate and ethylmethyl carbonate (3:7 mixture). Charge-discharge measurements were recorded on a MACCOR potentiostat at room temperature under a current rate of 20 mA/g between 2.5 V and 4.4 V. Rate capability experiments were conducted with a constant charge rate of 20 mA/g and discharge rates of 20, 100, 200, and 400 mA/g.

X-Ray Photoelectron Spectroscopy:

The chemical state of aluminum before and after electrochemical cycling was analyzed by XPS (Sigma Probe: Thermo VG Scientific) with monochromatic Al Kα radiation (1486.6 eV). The cycled 2032 coin cells were disassembled and washed with dimethyl carbonate (DMC), and transferred directly to XPS to eliminate air-exposure during sample transport.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A method of preparing a metal fluoride passivation coating on a cathode comprising:
    performing a atomic layer deposition cycles of TMA at a first deposition temperature between 50° C. and 300° C.; and
    performing b atomic layer deposition cycles of $WF_6$ at a second deposition temperature between 50° C. and 300° C., and
    forming a layer consisting of $AlW_xF_yC_z$ on the cathode such that the layer excludes oxygen, where x>0, y>0, and z≥0.

2. The method of claim 1, wherein the ratio of a:b is selected from the group consisting of 3:1, 2:1, 1:1, and 4:2.

3. The method of claim 1, wherein the first deposition temperature and the second deposition temperature are about 200° C.

4. The method of claim 1, wherein the cathode comprises $LiCoO_2$.

5. The method of claim 1, wherein z>0.

6. The method of claim 1, wherein the $AlW_xF_yC_z$ layer has a thickness of less than about 1 nm.

7. The method of claim 1, wherein the a cycles each comprise: a 1 second TMA dose followed by a 5 second gas purge.

8. The method of claim 1, wherein the b cycle depositions each comprise: a 1 second $WF_6$ dose followed by a 5 second gas purge.

9. The method of claim 1, wherein the metal fluoride passivation coating comprises particles of $WC_z$, wherein z≥0, disposed in a matrix of $AlF_3$.

* * * * *